(12) United States Patent
Ramalingam et al.

(10) Patent No.: US 11,915,918 B2
(45) Date of Patent: Feb. 27, 2024

(54) CLEANING OF SIN WITH CCP PLASMA OR RPS CLEAN

(71) Applicant: Applied Materials, Inc., Santa Clara, CA (US)

(72) Inventors: Jothilingam Ramalingam, Sunnyvale, CA (US); Yong Cao, San Jose, CA (US); Ilya Lavitsky, San Francisco, CA (US); Keith A. Miller, Mountain View, CA (US); Tza-Jing Gung, San Jose, CA (US); Xianmin Tang, San Jose, CA (US); Shane Lavan, Palo Alto, CA (US); Randy D. Schmieding, Saratoga, CA (US); John C. Forster, Mt. View, CA (US); Kirankumar Neelasandra Savandaiah, Karnataka (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 337 days.

(21) Appl. No.: 17/362,925

(22) Filed: Jun. 29, 2021

(65) Prior Publication Data

US 2022/0415636 A1 Dec. 29, 2022

(51) Int. Cl.
*H01J 37/34* (2006.01)
*C23C 14/56* (2006.01)
(Continued)

(52) U.S. Cl.
CPC .......... *H01J 37/3488* (2013.01); *C23C 14/54* (2013.01); *C23C 14/564* (2013.01);
(Continued)

(58) Field of Classification Search
CPC ............. H01J 37/3488; H01J 37/32357; H01J 37/3435; H01J 37/3441; H01J 37/3447;
(Continued)

(56) References Cited

U.S. PATENT DOCUMENTS 7,041,200 B2  5/2006  Le et al.
7,520,969 B2  4/2009  Miller
(Continued)

OTHER PUBLICATIONS

PCT International Search Report and Written Opinion in PCT/US2022/035236 dated Oct. 19, 2022, 10 pages.
(Continued)

*Primary Examiner* — Erin F Bergner
(74) *Attorney, Agent, or Firm* — Servilla Whitney LLC

(57) ABSTRACT

A physical vapor deposition processing chamber is described. The processing chamber includes a target backing plate in a top portion of the processing chamber, a substrate support in a bottom portion of the processing chamber, a deposition ring positioned at an outer periphery of the substrate support and a shield. The substrate support has a support surface spaced a distance from the target backing plate to form a process cavity. The shield forms an outer bound of the process cavity. In-chamber cleaning methods are also described. In an embodiment, the method includes closing a bottom gas flow path of a processing chamber to a process cavity, flowing an inert gas from the bottom gas flow path, flowing a reactant into the process cavity through an opening in the shield, and evacuating the reaction gas from the process cavity.

8 Claims, 8 Drawing Sheets

(51) Int. Cl.
  *H01J 37/32* (2006.01)
  *C23C 14/54* (2006.01)
(52) U.S. Cl.
  CPC .... *H01J 37/32357* (2013.01); *H01J 37/3435* (2013.01); *H01J 37/3441* (2013.01); *H01J 37/3447* (2013.01); *H01J 37/32091* (2013.01)
(58) Field of Classification Search
  CPC .. H01J 37/32091; C23C 14/54; C23C 14/564; C23C 14/34; C23C 14/50
  See application file for complete search history.

(56) References Cited

U.S. PATENT DOCUMENTS

| | | | |
|---|---|---|---|
| 7,670,436 B2 | 3/2010 | Miller et al. | |
| 9,127,362 B2 | 9/2015 | Scheible et al. | |
| 9,909,206 B2 | 3/2018 | Johanson et al. | |
| 10,546,733 B2 | 1/2020 | Savandaiah et al. | |
| 2005/0229849 A1 | 10/2005 | Silvetti et al. | |
| 2007/0017798 A1 | 1/2007 | Inagawa | |
| 2008/0178801 A1 | 7/2008 | Pavloff et al. | |
| 2009/0260982 A1 | 10/2009 | Riker et al. | |
| 2012/0180810 A1 | 7/2012 | Beckmann et al. | |
| 2014/0020629 A1* | 1/2014 | Tsai | H01J 37/3447 118/728 |
| 2014/0366912 A1 | 12/2014 | Green et al. | |
| 2015/0087098 A1* | 3/2015 | Kawanami | H10K 71/00 137/12 |
| 2017/0323768 A1 | 11/2017 | Zhang et al. | |
| 2018/0142343 A1 | 5/2018 | Zeng et al. | |
| 2019/0096638 A1* | 3/2019 | Lavitsky | H01J 37/32449 |
| 2019/0131167 A1* | 5/2019 | Rice | C23C 16/4584 |
| 2020/0395198 A1 | 12/2020 | Allen et al. | |
| 2021/0292888 A1* | 9/2021 | Lavitsky | C23C 14/564 |

OTHER PUBLICATIONS

Non-Final Office Action in U.S. Appl. No. 17/861,421 dated Oct. 5, 2023, 23 pages.

* cited by examiner

CLEANING OF SIN WITH CCP PLASMA OR RPS CLEAN

TECHNICAL FIELD

Embodiments of the disclosure pertain to the field of electronic device manufacturing, and in particular, to integrated circuit (IC) manufacturing. In particular, embodiments of the disclosure pertain to physical vapor deposition apparatus and in-chamber cleaning methods for physical vapor deposition apparatus.

BACKGROUND

During physical vapor deposition (PVD), materials including particulates and contaminants build up on the process kit (e.g., shields, edge rings). The materials formed on the process kit can contaminate subsequently processed wafers, requiring removal and/or replacement of the process kit components. As a result, it is challenging to deposit thick hard mask films by PVD due to frequent preventative maintenance (PM), which impacts throughput and cost of the wafer. Additionally, low specifications for small particle contamination are extremely difficult to meet using existing hardware.

Each opening of a PVD chamber creates opportunities for contamination and issues for throughput. The PVD chamber is opened when a target is depleted and in need of replacement. For each target life-cycle, the PVD chamber is often opened multiple times to replace the process kit components.

Other approaches for increasing the time between preventative maintenance include using a heated shield, texturing the process kit, using different material coatings on the metal parts to improve coefficient of thermal expansion matching, and cracking high-stress film. However, even these approaches are only able to run less than 2K wafers and still require frequent changing of the process kit.

Many chemical vapor deposition (CVD) chambers use a remote plasma source (RPS) to clean the chamber and coat the chamber before running a deposition process. However, remote plasma source cleanings have not been done in PVD chambers due to the difficulty of protect all metal parts inside the chamber.

Therefore, there is a need in the art for methods and apparatus that allow the process kit to run full target life cycle.

SUMMARY

One or more embodiments of the disclosure are directed to a processing chamber. In some embodiments, the processing chamber comprises a target backing plate in a top portion of the processing chamber, wherein the substrate support having a support surface spaced a distance from the target backing plate to form a process cavity a substrate support in a bottom portion of the processing chamber; a deposition ring positioned at an outer periphery of the substrate support, wherein the deposition ring has an outer portion with a contoured shape; and a shield forming an outer bound of the process cavity, wherein the shield having a top shield end in the top portion of the processing chamber and a bottom shield end in the bottom portion of the processing chamber, the top end positioned around a periphery of the target backing plate and the bottom end positioned around a periphery of the substrate support, the bottom end including a contoured surface having a complementary shape to the outer portion of the deposition ring.

In some embodiments, the top portion of the processing chamber comprises a top gas flow path between a periphery of the target backing plate and the top of the shield.

In some embodiments, the bottom portion of the processing chamber comprises a bottom gas flow path between the shield and the deposition ring.

Another embodiment of the disclosure is directed to an in-chamber cleaning method. In some embodiments, the method comprises closing a bottom gas flow path of a processing chamber to a process cavity, the process cavity is defined by a substrate support, a target backing plate and a shield, when the processing chamber is in a process position; flowing an inert gas from an inert gas inlet into a chamber, wherein the chamber is defined by the substrate support, a grounding bracket, the shield, an adapter and a chamber body; flowing a reactant from a reactant inlet into the process cavity of through an opening in the shield; and evacuating the reactant from the process cavity through a top gas flow path, wherein the top gas flow path located within a top portion of the processing chamber, the top gas flow path passing over the shield.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The disclosure includes methods and apparatus for extending the target life cycle of the process kit. In some embodiments, the method for extending the target life cycle comprises cleaning a built-up material from the interior processing chamber components (e.g., the process kit components) using a reactive species. In some embodiments, cleaning comprises selectively etching and/or sputtering the accumulated material from the internal components. In some embodiments, the built-up material comprises a built-up metal film and/or a built-up dielectric film. In some embodiments, the accumulated dielectric film comprises SiN film.

In one or more embodiments, the processing chamber is configured to extend the life cycle of the process kit. In some embodiments, the processing chamber runs substantially a full target life cycle for the process kit. In some embodiments, the processing chamber runs a full target life 3600 KWHR SiN process (1500 Å film more than 10K).

Figure 1:
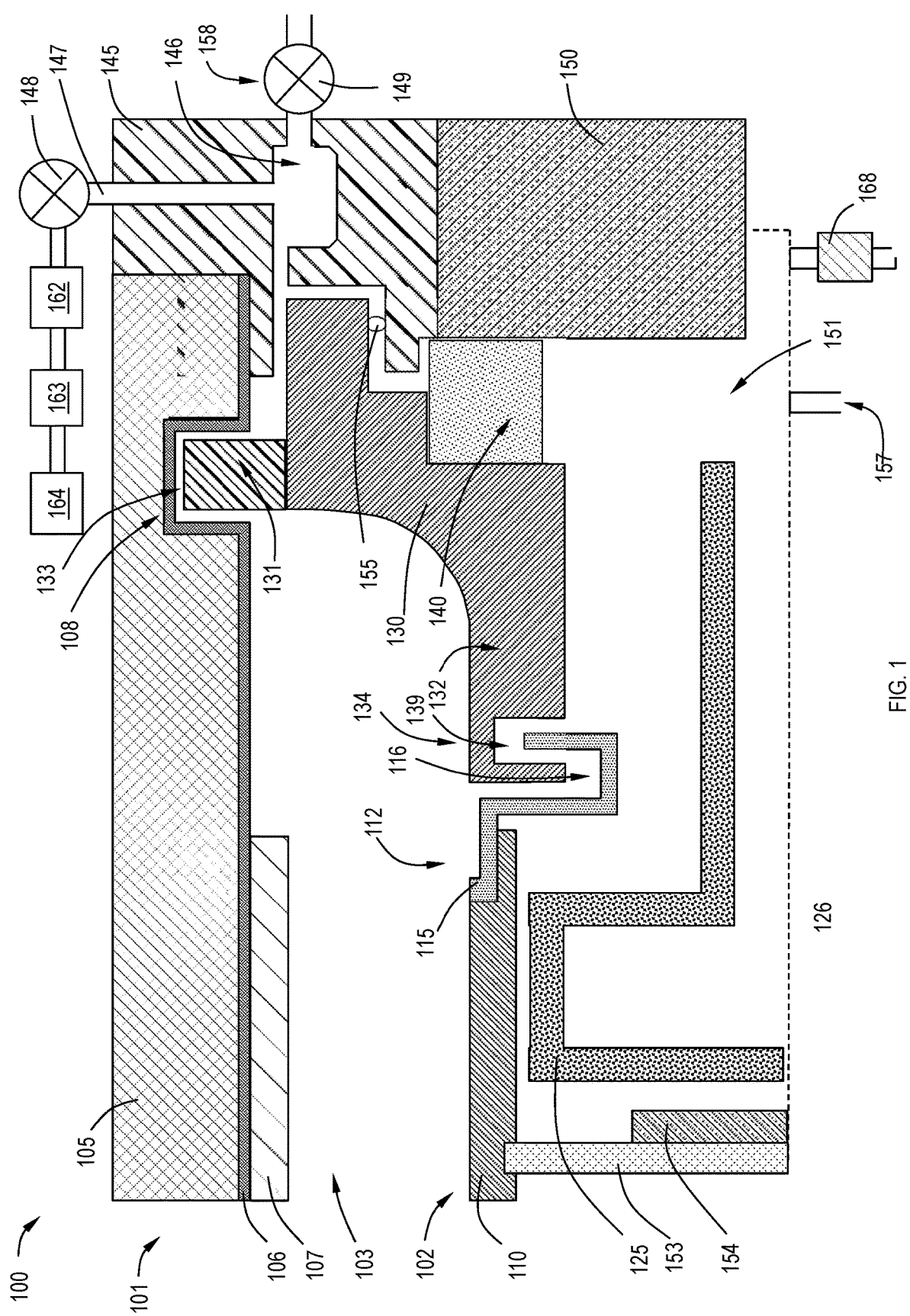
FIG. 1 shows a cross-sectional schematic view of a physical vapor deposition chamber in accordance with one or more embodiment of the disclosure.

FIG. 1 shows a schematic representation of a processing chamber 100 according to one or more embodiment of the disclosure. The processing chamber 100 comprises a top portion 101, a bottom portion 102 and at least one process cavity 103 between.

The top portion 101 comprises a target backing plate 105 facing the at least one process cavity 103. In some embodiments, the target backing plate 105 comprises copper chromium (CuCr). In some embodiments, the target backing plate 105 supports a target 107, the target faces the process cavity 103. In some embodiments, the target comprises silicon or derivative thereof. In some embodiments, the top portion 101 further comprises a target bond 106. The target bond 106 supports attaching the target 107 to the target backing plate 105. The target bond 106 is located between the target backing plate 105 and the target 107. The target bond 106 can be any suitable bonding material known to the skilled artisan. In some embodiments, the target bond 106 comprises indium or derivative thereof.

The bottom portion 102 comprises a substrate support 110 having a support surface 111 spaced a distance from the target backing plate 105 to form the process cavity 103. In some embodiments, the distance is in a range of from 50 mm to 100 mm, from 52.5 mm to 100 mm, from 55.5 mm to 100 mm, from 50 mm to 80 mm, from 52.5 mm to 80 mm, from 55.5 mm to 80 mm, from 50 mm to 60 mm, from 52.5 mm to 60 mm, from 55.5 mm to 60 mm or from 52.5 mm to 55.5 mm. In some embodiments, the process cavity 103 has a height of 52.5 mm.

In some embodiments, the substrate support 110 comprises a mounting plate supporting a pedestal and electrostatic chuck. The electrostatic chuck (ESC) is protected from the reactive gases in the process cavity 103 with an electrostatic chuck cover. In some embodiments, the electrostatic chuck (ESC) has a cover comprising a protective wafer. In some embodiments, when in cleaning mode, the protective wafer functions to protect the electrostatic chuck (ESC) from damage due to the reactive species in the process cavity 103.

In some embodiments, a deposition ring 115 is positioned at an outer periphery 112 of the substrate support 110. The deposition ring 115 has a contoured shaped outer portion 116. In some embodiments, the deposition ring 115 comprises aluminium oxide or derivative thereof.

The bottom portion 102 comprises a grounding bracket 125 below the substrate support 110, deposition ring 115 and the shield 130. In some embodiments, the grounding bracket 125 comprises stainless steel. In some embodiments, the grounding bracket 125 comprises nickel plated stainless steel.

The processing chamber 100 comprises a shield 130. The shield 130 forms an outer bound of the process cavity 103. In some embodiments, the shield 130 comprises a shield top end 131 in the top portion 101 and a shield bottom end 132 in the bottom portion 102. In some embodiments, the shield 130 is a single component. In some embodiments, the shield top end 131 and the shield bottom end 132 are separate components and are fastened together by fasteners.

The shield top end 131 comprises a complementary shape to a groove 108 of the target backing plate 105. The top portion 101 of the processing chamber 100 comprises a top gas flow path 133 between the groove 108 at the periphery of the target backing plate 105 and the shield top end 131. In some embodiments, as illustrated, the target bond 106 extends along the contours of the groove 108 of the backing plate 105.

The shield bottom end 132 is positioned around the outer periphery 112 of the substrate support 110. The shield bottom end 132 includes a contoured surface 134 having a complementary shape to the outer portion 116 of the deposition ring 115. The shield bottom end 132 and the deposition ring 115 forms a bottom gas flow path 139. Stated differently, the bottom gas flow path 139 extends between the contoured surface 134 of the shield bottom end 132 and the contoured surface 116 of the deposition ring 115.

In some embodiments, the bottom portion 102 of the processing chamber 100 comprises a bottom gas flow path 139 between the shield bottom end 132 and the deposition ring 115.

The processing chamber 100 comprises a heater 140. In some embodiments, the heater 140 acts as a large thermal mass to maintain temperatures within the process cavity 103. The heater 140 is located on an outer periphery of the shield bottom end 132. The heater 140 functions to increase heat mass capacity of the processing chamber 100. In some embodiments, the heater 140 functions to maintain a temperature of the shield 130 in a range of from 150° C. to 250° C. or from 200° C. to 250° C.

The processing chamber 100 comprises an adapter 145. The adapter 145 is located on outer periphery of the top portion 101 in contact with and optionally supporting the target backing plate 105 and/or the target bond 106. In some embodiments, the adapter 145 extends to the heater 140. In some embodiments, the adapter 145 comprises a plenum 146 fluidly connected to the process cavity 103 via a space 152 between the top portion 101 and the shield. In some embodiments, the adapter 145 comprises aluminium.

In one or more embodiments, the processing chamber 100 comprises a roughing line 147 connected to a switch valve manifold 148. In some embodiments, the plenum 146 is operatively connected to the roughing line 147 having the switch valve manifold 148. The switch valve manifold 148 is connected to a roughing pump 162. The switch valve manifold 148 is configured to allow a flow of gas from the process cavity 103 to the roughing pump 162 through the top flow path 133 and the space 152 when the switch valve manifold 148 is opened and to prevent flow to the roughing pump 162 when the switch valve manifold 148 is closed. In some embodiments, the processing chamber 100 is configured to allow a flow of gas into the process cavity 103 through the top flow path 133 when the switch valve manifold 148 is closed. In some embodiments, the switch valve manifold 148 is opened when in cleaning mode.

In one or more embodiments, the processing chamber 100 comprises an abatement assembly 163 connected to the roughing pump 162. In cleaning mode, the roughing pump 162 removes gas from the process cavity 103 via top gas flow path 133 towards the abatement assembly 163. In one or more embodiments, the processing chamber 100 comprises an exhaust assembly 164 connected to the abatement assembly 163. In some embodiments, the exhaust assembly 164 comprises house exhaust. In cleaning mode, the exhaust assembly 164 removes the gas from the abatement assembly 163 and the processing chamber 100.

The processing chamber 100 comprises a chamber body 150 forming an interior volume 151 of the processing chamber. A top of the interior volume 151 is closed by the top portion 101, the bottom portion 102 and the process cavity 103. In some embodiments, the chamber body 150 supports the adapter 145 from below. The interior volume 151 contains the substrate support 110, the grounding bracket 125, the shield 130, the adapter 145 within the chamber body 150. The bottom gas flow path 139 fluidly connects the process cavity 103 to the interior volume 151 via a space between the shield 130 and the deposition ring 115. In some embodiments, the chamber body 150 comprises stainless steel.

The processing chamber 100 comprises a containment o-ring 155 between the shield bottom end 132 and the adapter 145. The containment o-ring 155 functions to prevent any fluid contact between the top gas flow path 133 and the interior volume 151 and/or the heater 140 via a space between the shield 120 and the adaptor 145. In some embodiments, the containment o-ring 155 is resistant to fluoride radicals and/or fluorine sputtering.

The bottom portion 102 comprises a shaft 153 and a hoop lift component 154. The substrate support 110 and the grounding bracket 150 are positioned on the shaft 153. The shaft 153 is operatively connected with the hoop lift component 154. In some embodiments, the hoop lift component 154 moves the bottom portion 102 up or down.

In one or more embodiments, the processing chamber 100 comprises an inert gas inlet 157. The inert gas inlet 157 functions to maintain a positive pressure in the interior volume 151. The positive pressure in the interior volume 151 prevents leaking of any gas into the interior volume 151 from the process cavity 103 or the space between the shield 130 and the adapter 145. In some embodiments, the inert gas comprises argon, nitrogen ($N_2$) or combination thereof. In some embodiments, the inert gas further comprises a protective gas. In some embodiments, the protective gas comprises oxygen ($O_2$) or hydrogen ($H_2$).

In one or more embodiments, the processing chamber 100 comprises a turbo pump housing 168 in fluid communication with the process cavity 103 through the bottom flow path 139.

In one or more embodiments, the processing chamber 100 comprises a process gas inlet 158. The process gas inlet 158 comprises a process gas inlet valve 149. In some embodiments, a process gas reservoir (not shown) is connected to the process gas inlet valve 149. When in deposition mode, the processing chamber 100 is configured to allow a flow of the process gas through the top gas flow path 133, process cavity 103 and bottom gas flow path 139. In some embodiments, the process gas inlet 158 can be used to deliver the reactant to the process cavity 103 via the top gas flow path 133.

Figure 2:
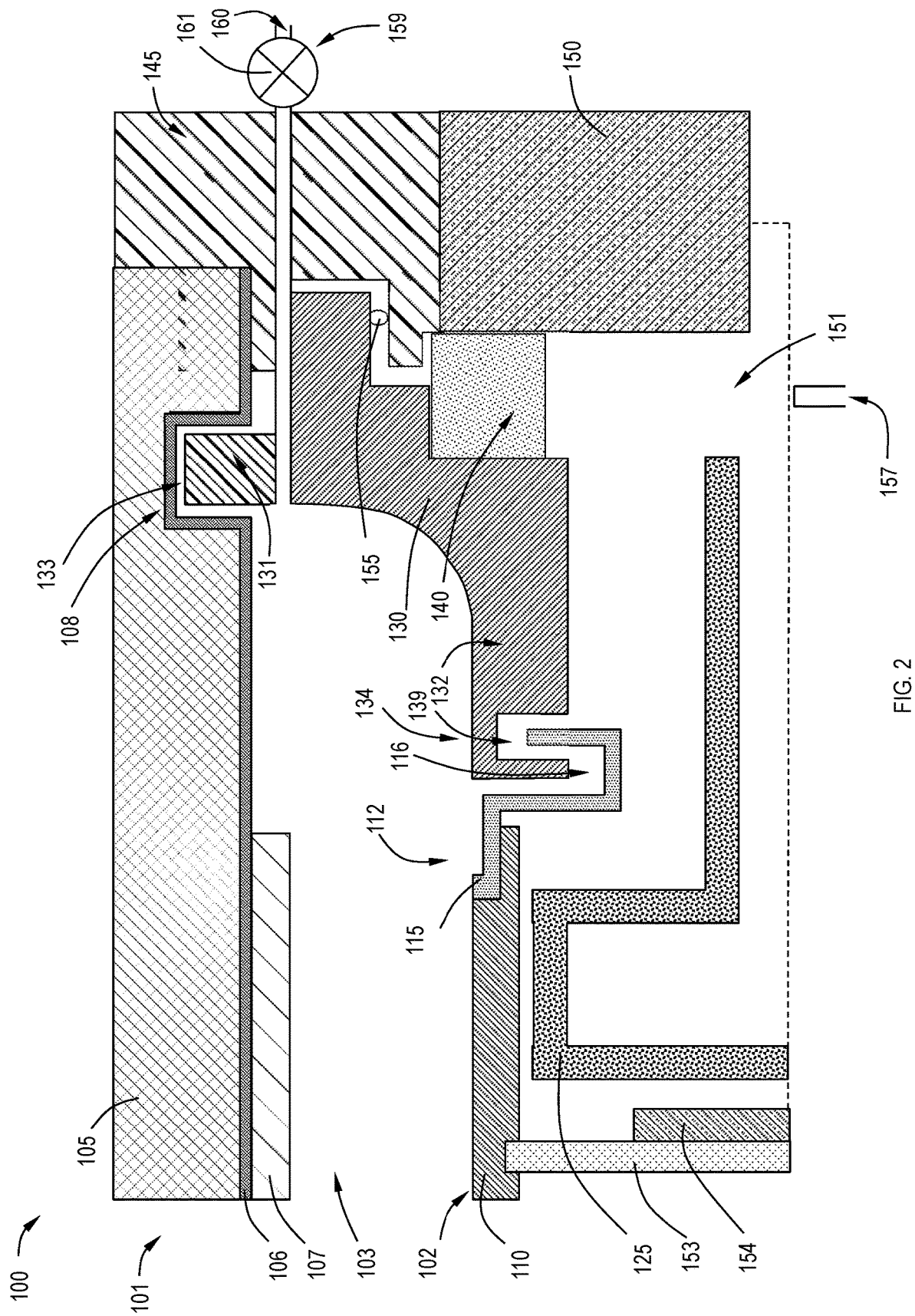
FIG. 2 shows a cross-sectional schematic view of a physical vapor deposition chamber in accordance with one or more embodiment of the disclosure.

In one or more embodiments, the processing chamber 100 comprises a reactant inlet 159, the reactant inlet 159 comprises a reactant inlet path 160 and a reactant inlet valve 161. The reactant inlet valve 161 is in fluid communication with the process cavity 103 through the top flow path 133. FIG. 2 shows an embodiment of the processing chamber 100, wherein the processing chamber 100 comprises the reactant inlet path 160. According to the embodiment of FIG. 2, the reactant inlet path 160 passes through the adapter 145 and opens into the process cavity 103 through a hole between the shield top end 131 and the shield bottom end 132. In some embodiments, the processing chamber 100 comprises more than one reactant inlets 159. In some embodiment the processing chamber 100 comprises at least two reactant inlets 159. In some embodiments, the processing chamber 100 comprises two reactant inlets 159, the reaction inlets 159 are 90° apart. In some embodiments, the reactant inlet 159 comprises stainless steel.

In some embodiment, the reactant inlet 159 is connected to a reaction gas reservoir (not shown). In some embodiments, the reactant inlet path 160 is connected to the reaction gas reservoir via the reactant inlet valve 161. In some embodiments, when in cleaning mode, the reactant inlet valve 161 is opened establishing fluid communication between the process cavity 103 and the reaction gas reservoir. In some embodiments, when in deposition mode, the reaction inlet valve is closed disconnecting fluid communication between the process cavity 103 and the reaction gas reservoir.

In another embodiment of the disclosure, the reactant inlet 159 is connected to a remote plasma source (not shown). In some embodiments, the reactant inlet path 160 is connected to the remote plasma source via the reactant inlet valve 161. In some embodiments, when in cleaning mode, the reactant inlet valve 161 is opened establishing fluid communication between the process cavity 103 and the remote plasma source. In some embodiments, when in deposition mode, the reaction inlet valve is closed disconnecting fluid communication between the process cavity 103 and the remote plasma source.

Figure 3:
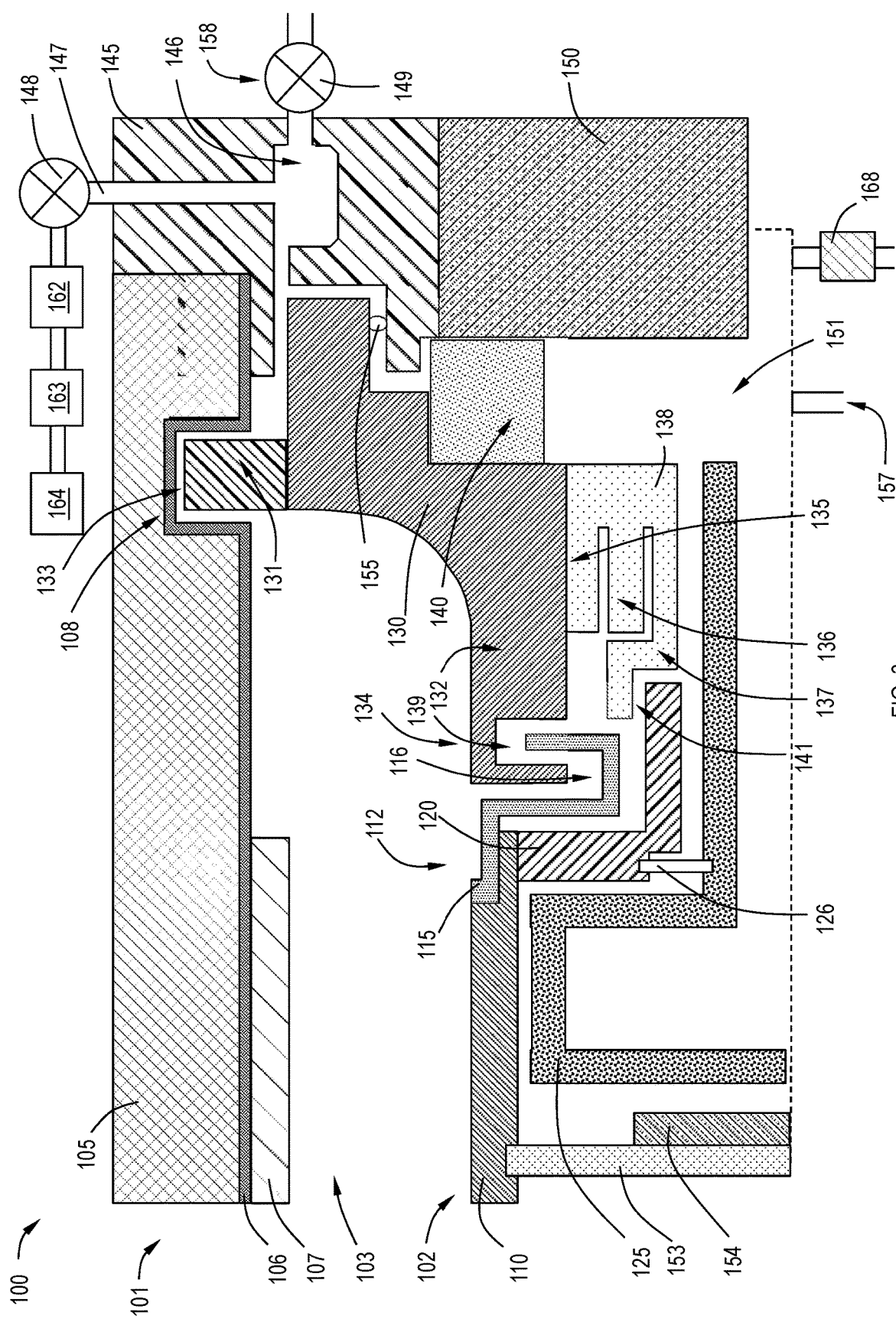
FIG. 3 shows a cross-sectional schematic view of a physical vapor deposition chamber in accordance with one or more embodiment of the disclosure.
Figure 4:
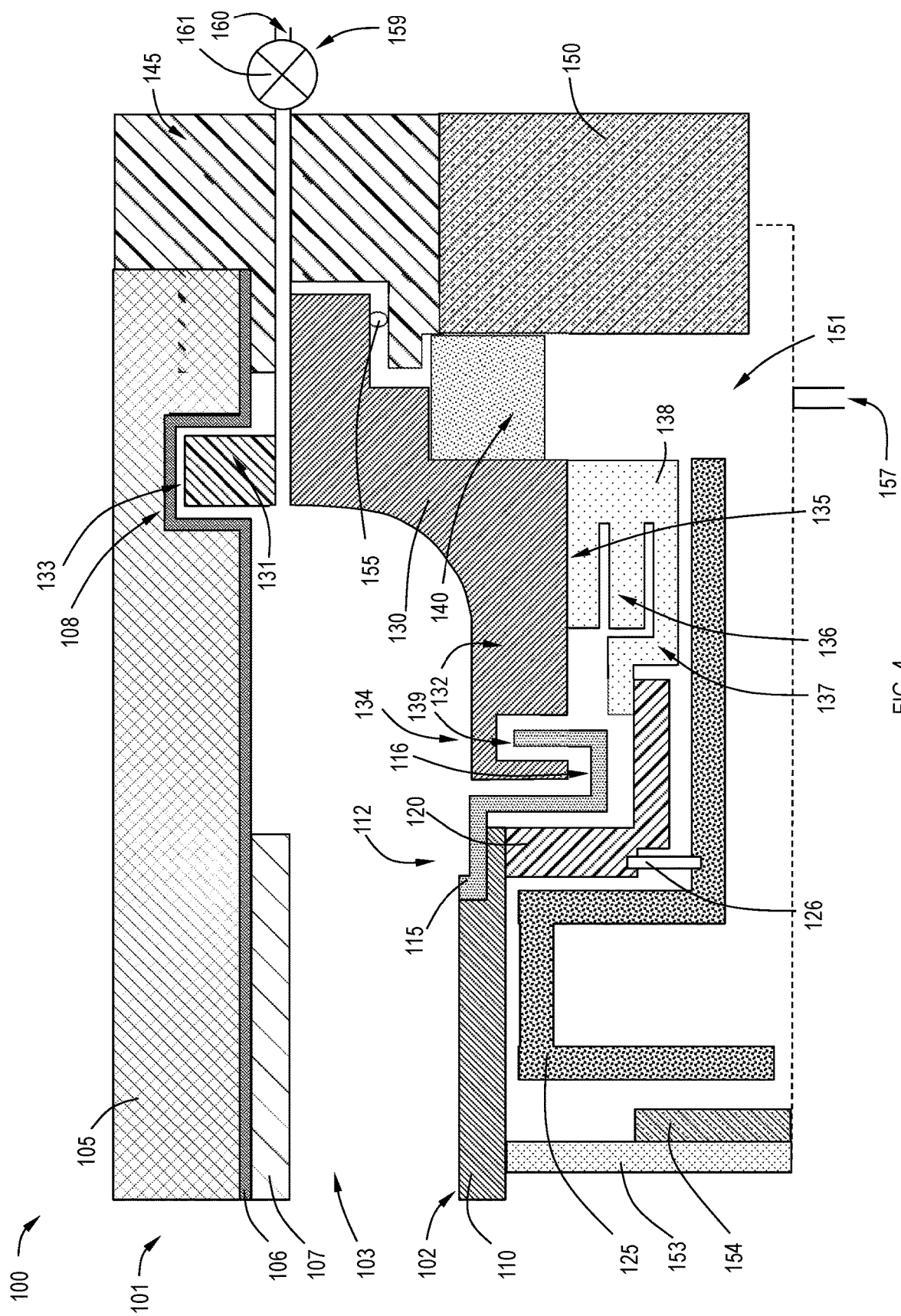
FIG. 4 shows a cross-sectional schematic view of a physical vapor deposition chamber in accordance with one or more embodiment of the disclosure.

FIGS. 3 and 4 shows an embodiment of the disclosure when the processing chamber 100 is in process mode and cleaning mode respectively. Accordingly, in some embodiments, the bottom portion 102 comprises a sealing bracket 120. The sealing bracket 120 is positioned on an opposite side of the substrate support 110 from the target backing plate 105 so that the deposition ring 115 is between the target backing plate 105 and the sealing bracket 120. In some embodiments, the sealing bracket 120 comprises nickel plated stainless steel. In some embodiments, the grounding bracket 125 is located below the sealing bracket 120. In some embodiments, the sealing bracket 103 is secured to the grounding bracket 125 via a fastener 126. In some embodiments, the fastener 126 comprises stainless steel.

In some embodiments, the processing chamber 100 comprises a bellows assembly 138 connected to or in contact with the shield 130. In some embodiments, the bellows assembly 138 is located on an outer periphery of and the shield 130 and below the shield bottom end 132. The bellows assembly 138 comprises a top bellows flange 135, a bellows 136 and a bottom bellows flange 137. The top bellows flange 135 is located below the shield bottom end 132 next to the contoured surface on outer side of the shield bottom end 132. The top bellows flange 135 and the bottom bellows flange 137 support the bellows 136 therebetween. In some embodiments, one or more of the top bellows flange 135 and the bottom bellows flange 137 comprises nickel plated stainless steel.

In one or more embodiments, the processing chamber 100 comprises an elastomeric sealant between the top bellow flange 135 and the shield bottom end 132. In some embodiments, the elastomeric sealant prevents reactant leakage in the interior volume 151 through a space between the top bellow flange 135 and the shield bottom end 132. In some embodiments, the elastomeric sealant is resistant to fluoride radical and/or fluorine sputtering.

In some embodiments, the bottom gas flow path 139 further comprises a gap 141 between the sealing bracket 120 and the bellows assembly 138. Accordingly, in some embodiments, the bottom gas flow path 139 fluidly connects the process cavity 103 to the interior volume 151 via a space between the shield 130 and the deposition ring 115 and a space between the sealing bracket 120 and the bellows assembly 138.

FIG. 3 shows an embodiment, the process cavity 103 is fluidly connected to the interior volume 151 via the bottom gas flow path 139. In some embodiments, the deposition ring 115 and sealing bracket 120 are movable between a process position (as shown in FIG. 3) where there is a gap 141 between the sealing bracket 120 and the deposition ring 115 and a cleaning position (as shown in FIG. 4) where the sealing bracket 120 contacts the bellows assembly 138. In some embodiments, the hoop lift component 154 moves the bottom portion 102 up to contact the sealing bracket 120 with the bottom bellow flange 135 and thereby sealing the process cavity 103. The hoop lift component 154 moves the bottom portion 102 down to contact the sealing bracket 120 with the bottom bellows flange 137 and thereby opening the bottom gas flow path 141. FIG. 4 show the sealed process cavity 103 in which exchange of fluid between the process cavity 103 and the interior volume 151 via the bottom gas flow path 139 is prevented.

Accordingly, in some embodiments, the turbo pump housing 168 is in fluid communication with the process cavity 103 through the bottom flow path 139 when the sealing bracket 120 and deposition ring 115 are in the process position. The turbo pump housing 168 is isolated from the process cavity 103 via the bottom gas flow path when the sealing bracket 120 and deposition ring 115 are in the cleaning position.

Figure 5:
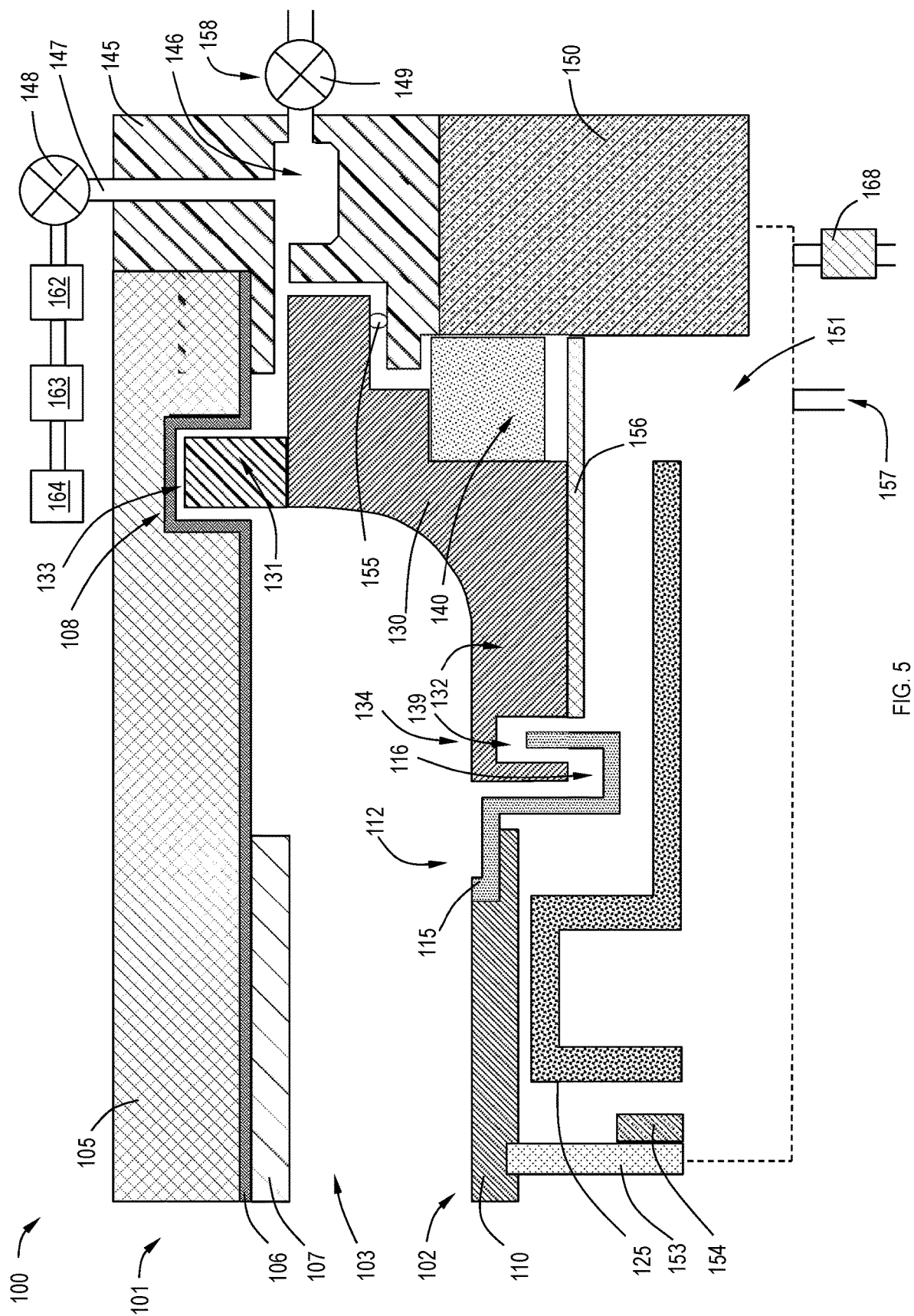
FIG. 5 shows a cross-sectional schematic view of a physical vapor deposition chamber in accordance with one or more embodiment of the disclosure.
Figure 6:
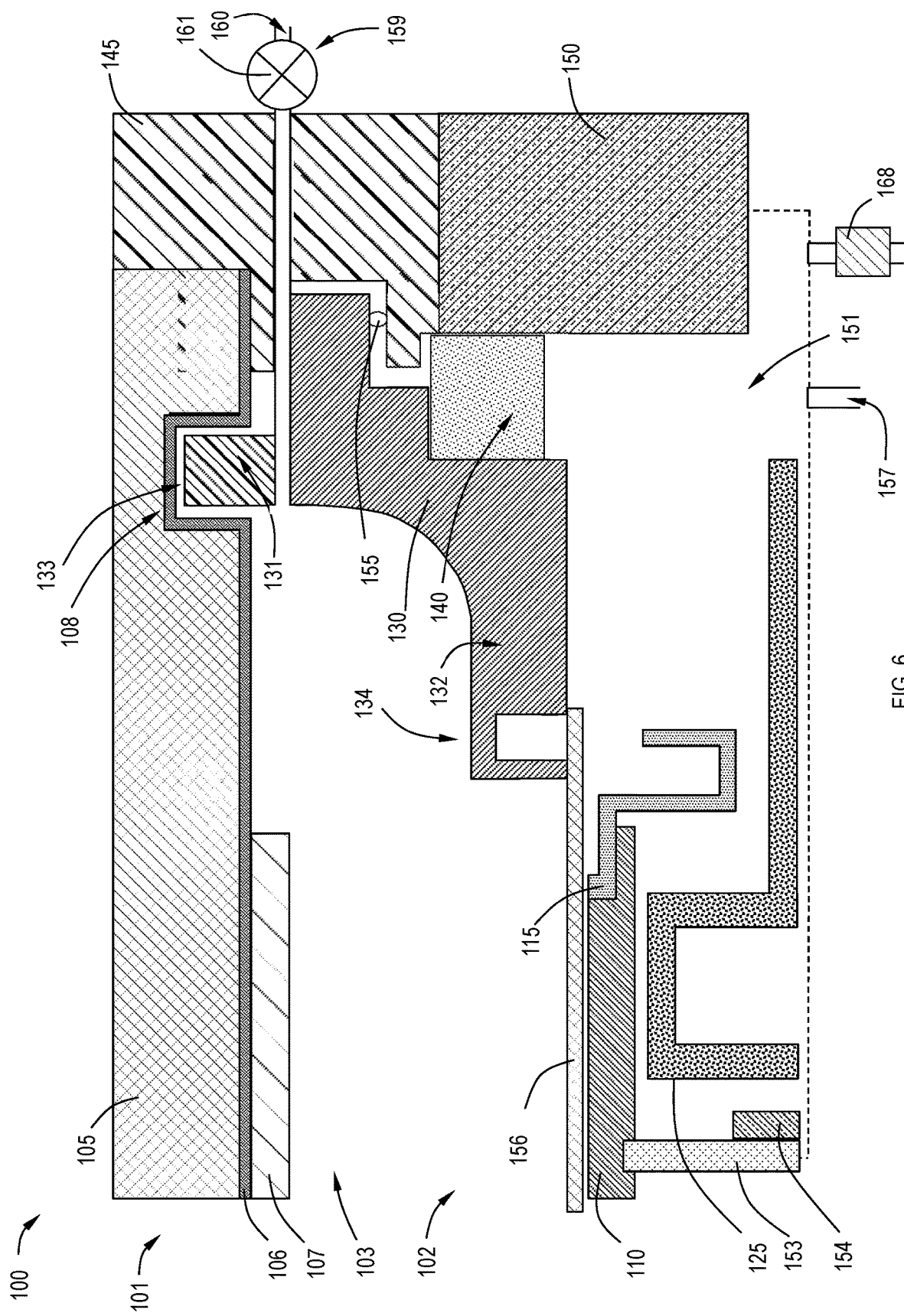
FIG. 6 shows a cross-sectional schematic view of a physical vapor deposition chamber in accordance with one or more embodiment of the disclosure.

FIGS. 5 and 6 show another embodiment of the disclosure, wherein the process cavity comprises a shutter disk 156. In some embodiments, the shutter disk 156 is located below the shield 130. In some embodiments, one or more of the substrate support 110, the deposition ring 115 or the electrostatic chuck (ESC) are movable between process position and cleaning position. In some embodiments, the shutter disk 156 functions to disconnect fluid connection between the process cavity 103 and the interior volume 151, when the bottom portion 102 is in the interior volume 151. In some embodiments, the hoop lift component 154 moves one or more of the substrate support 110, the deposition ring 115 or the electrostatic chuck (ESC) down into the interior volume 151. In some embodiments, the shutter disk 156 functions to disconnect fluid connection between the process cavity 103 and the interior volume 151, when one or more of the substrate support 110, the deposition ring 115 or the electrostatic chuck (ESC) are in the interior volume 151. In some embodiments, as shown in FIG. 5, when in process position, the shutter disk 156 moves out horizontally for the substrate support 110 to move up and form the process cavity 103. In some embodiments, as shown in FIG. 6, when in cleaning position, the substrate support 110 moves down for the shutter disk 156 to disconnect a fluid connection between the substrate support 110 and the process cavity 103. In some embodiments, the hoop lift component 154 moves the bottom portion 102 down for the shutter disk 156 to disconnect a fluid connection between the substrate support 110 and the process cavity 103. In some embodiments, the shutter disk 156 slides horizontally for the hoop lift component 154 to move the bottom portion 102 up for the substrate support 110 to form the process cavity 103.

In some embodiments, one or more of the shield 130, the bellows assembly 138, the target backing plate 105, the substrate support 110, the deposition ring 115, the sealing bracket 120, the chamber body 150, the electrostatic chuck (ESC), the shutter disk 156, the shaft 153, the hoop lift component 154, the roughing line 160, the target 107, the target bond 106, the o-ring 155, the turbo pump housing 168, the abatement assembly 163 or the exhaust assembly 164 are resistant to fluoride radicals and/or fluorine sputtering.

In some embodiments, one or more of one or more of the shield 130, the bellows assembly 138, the target backing plate 105, the substrate support 110, the deposition ring 115, the sealing bracket 120, the chamber body 150, the electrostatic chuck (ESC), the shutter disk 156, the shaft 153, the hoop lift component 154, the roughing line 147, the target 107, the target bond 106, the o-ring 155, the turbo pump housing 168, the abatement assembly 163 or the exhaust assembly 164 are made of one or more of aluminum, alumina, yttria and/or nickel-plated SSL.

Figure 7:
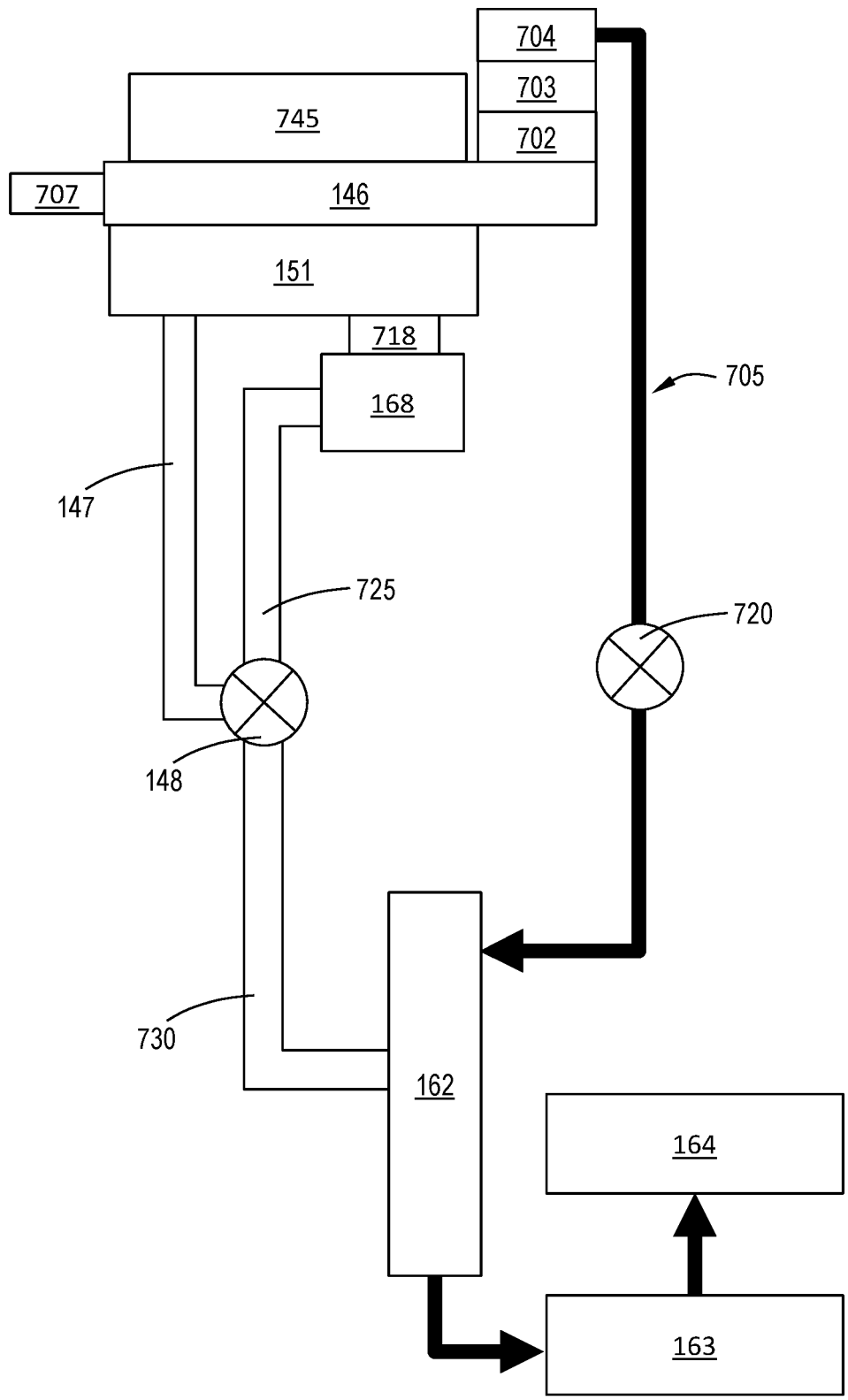
FIG. 7 shows a schematic representation of a process chamber and gas flow paths in accordance with one or more embodiment of the disclosure.

FIG. 7 shows a schematic representation of a process chamber and gas flow paths in accordance with one or more embodiment of the disclosure. In some embodiments, the plenum 146 is fluidly connected to the roughing pump 162 via an upper gate valve 702 and a throttle valve 704. In some embodiments, pressure gauge 703 and/or pressure gauge 707 are positioned along the flow path. When the upper gate valve 702 and the throttle valve 704 are open, gas flow along outlet path 705 to the roughing pump 162. In some embodiments, the outlet path comprises an outlet valve 720. When the upper gate valve 702 and/or throttle valve 704 is closed, gas flows to the roughing pump 162 through the roughing line 147 or the turbo pump housing 168. In some embodiments, the interior volume 151 is operatively connected to the turbo pump housing 168 via a lower gate valve 718. If the lower gate valve 718 is closed, the gas flow directly to the roughing pump 162 through the roughing line 147 and the switch valve manifold 148. When the lower gate valve 718 is opened, the gas flows through the lower gate valve 718 and the turbo pump housing 168 to the roughing pump 162 via turbo pump housing outlet 725 and the switch valve manifold 148. The switch valve manifold 148 can be used to control whether gas flow through the roughing line 147 or through the turbo pump housing 168 to the roughing pump 162 via switch valve manifold connector path 730. The gas flows from the roughing pump 162 to the abatement assembly 163. Subsequently, the gas flows from the abatement assembly 163 to the exhaust assembly 164 and exhausted. In some embodiments, the turbo pump housing 168 comprises a turbo pump.

Figure 8:
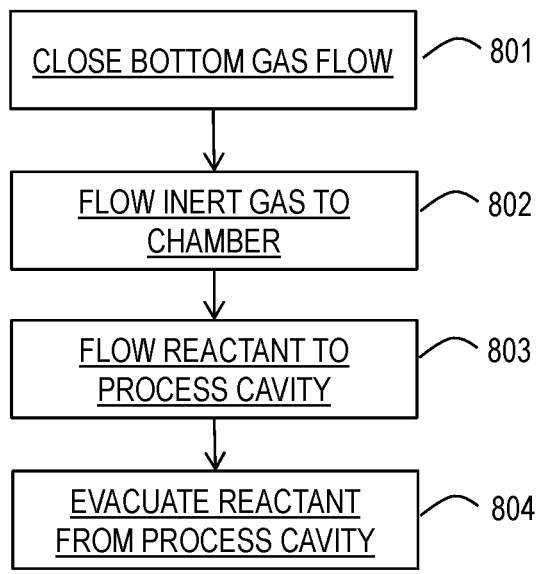
FIG. 8 shows the in-chamber cleaning method in accordance with one or more embodiment of the disclosure.

Another aspect of the disclosure provides an in-chamber cleaning method. FIG. 8 shows an embodiment of the in-chamber cleaning method 800. According to FIG. 8, the method 800 comprises closing the bottom gas flow path 139 at block 801; flowing inert gas from the inert gas inlet in the interior volume 151 to maintain a positive pressure in the interior volume 151, at block 802; flowing a reactant from a reactant inlet into the process cavity 103 through an opening in the shield 130, at block 803; and evacuating the reactant from the process cavity through the top gas flow path 133, at block 804.

In one or more embodiments, during block 801, the sealing bracket 120 is moved a distance (e.g., about 2.5 mm vertically) to contact the bellows assembly 138 to close the bottom gas flow path 139. In some embodiments, the after operation 801, a distance between the target 107 and the substrate support 110 is in a range of from 50 mm to 100 mm, from 52.5 mm to 100 mm, from 55.5 mm to 100 mm, from 50 mm to 80 mm, from 52.5 mm to 80 mm, from 55.5 mm to 80 mm, from 50 mm to 60 mm, from 52.5 mm to 60 mm, from 55.5 mm to 60 mm or from 52.5 mm to 55.5 mm. In some embodiments, the after operation 801, a distance between the target 107 and the substrate support 110 is 55.5 mm.

In one or more embodiments, during block 801, the bottom portion 102 is moved down to the interior volume 151 and the shutter disk 156 moves in horizontally disconnect fluid connection between the process cavity 103 and the interior volume 151.

In one or more embodiments, operation 802 comprises flowing Ar, $N_2$ or combination thereof into the interior volume 151 to maintain the positive pressure. In some embodiments, the positive pressure is in a range of from 2 Torr to 3 Torr.

In one or more embodiments, one or more operations of the method 800 is independently performed at a pressure is in a range of from $10^{-3}$ mTorr to 3 Torr, from $10^{-3}$ mTorr to 2 Torr, from $10^{-3}$ mTorr to 1 Torr, from $10^{-3}$ mTorr to 800 mTorr, from $10^{-3}$ mTorr to 600 mTorr, from $10^{-3}$ mTorr to 400 mTorr, from $10^{-3}$ mTorr to 200 mTorr, from $10^{-3}$ mTorr to 100 mTorr, from $10^{-3}$ mTorr to 1 mTorr, from $10^{-3}$ mTorr to $10^{-2}$ mTorr, from 50 mTorr to 3 Torr, from 50 mTorr to 2 Torr, from 50 mTorr to 1 Torr, from 50 mTorr to 800 mTorr, from 50 mTorr to 600 mTorr, from 50 mTorr to 400 mTorr, from 50 mTorr to 200 mTorr, from 50 mTorr to 100 mTorr, from 100 mTorr to 3 Torr, from 100 mTorr to 2 Torr, from 100 mTorr to 1 Torr, from 100 mTorr to 800 mTorr, from 100 mTorr to 600 mTorr, from 100 mTorr to 400 mTorr, from 100 mTorr to 200 mTorr, from 200 mTorr to 3 Torr, from 200 mTorr to 2 Torr, from 200 mTorr to 1 Torr, from 200 mTorr to 800 mTorr, from 200 mTorr to 600 mTorr, from 200 mTorr to 400 mTorr, from 400 mTorr to 3 Torr, from 400 mTorr to 2 Torr, from 400 mTorr to 1 Torr, from 400 mTorr to 800 mTorr, from 400 mTorr to 600 mTorr, from 600 mTorr to 3 Torr, from 600 mTorr to 2 Torr, from 600 mTorr to 1 Torr, from 600 mTorr to 800 mTorr, from 800 mTorr to 3 Torr, from 800 mTorr to 2 Torr, from 800 mTorr to 1 Torr or from 1 Torr to 3 Torr, within the process cavity 103. In some embodiments, during cleaning, the pressure in the chamber is greater than the pressure in the process cavity 103. In some embodiments, during cleaning, the pressure in the chamber is greater than the pressure in the process cavity 103 by an amount in the range of 1 to 3 Torr.

In some embodiments, during the operation 803, the shield 130 is maintained at a temperature in a range of from 150° C. to 250° C. or from 200° C. to 250° C. In some embodiments, the heater 140 functions to maintain the shield 130 at a temperature in a range of from 150° C. to 250° C. or from 200° C. to 250° C. In some embodiments, the shield 130 temperature in a range of from 150° C. to 250° C. helps removing the build-up material. In some embodiments, during the operation 803, substrate support 110 is maintained at a temperature in a range of from from 150° C. to 250° C. or from 200° C. to 250° C. In some embodiments, during the operation 803, the target 107 is maintained at a temperature in a range of from 30° C. to 65° C., from 40° C. to 65° C., from 50° C. to 65° C., from 30° C. to 60° C., from 40° C. to 60° C., from 50° C. to 60° C.

In one or more embodiments, the operation 803 comprises flowing reactant to the process cavity 103. In some embodiments, the reactant comprises fluoride radicals. In some embodiments, the fluoride radicals are generated from an $NF_3$. In some embodiments, the operation 804 selectively etches the built-up material. In some embodiments, the selective etching is performed with the fluoride radicals. In some embodiments, the fluoride radicals are generated from the $NF_3$ thermally within the processing chamber 100. In some embodiments, the fluoride radical is formed by applying RF bias to $NF_3$. In some embodiments, the in-chamber cleaning method further comprises applying bias to the substrate support. In some embodiments, the in-chamber cleaning method further comprises applying bias to the pedestal. In some embodiments, the fluoride radicals are generated at 13.54 MHz (<1 Kwatt) radio frequency (RF). In some embodiments, the fluoride radicals are generated by applying bias in a range of from 500 W to 1000 W. In some embodiments, the fluoride radicals are generated by applying 1000 W bias.

In some embodiments, the reactant comprises a reaction gas. In some embodiments, the reaction gas is flown into the process cavity 103 at a dose 1 liter to 3 liters. In some embodiments, the reaction gas comprises one or more of $NF_3$, oxygen ($O_2$), hydrogen ($H_2$) or argon (Ar). In some embodiments, when in cleaning mode, 1 liter of $NF_3$ is flown into the process cavity 103. In some embodiments, when in cleaning mode, 3 liters of one or more of hydrogen ($H_2$), oxygen ($O_2$) or argon (Ar) in flown into the process cavity 103. In some embodiments, the reaction gas comprises $NF_3$ and one or more of $O_2$, $H_2$ or Ar. In some embodiments, the reaction gas comprises $NF_3$ and $H_2$ with a $NF_3:H_2$ ratio in a range of 1:1 to 1:3. In some embodiments, the reaction gas comprises $NF_3$ and $O_2$ with a $NF_3:O_2$ ratio in a range of 1:1 to 1:3. In some embodiments, argon is co-flowed with one or more of the $NF_3$, $H_2$ or $O_2$.

In one or more embodiments, the reaction gas further comprises a carrier gas. In some embodiments, the carrier gas comprises an inert gas. In some embodiments, the inert gas comprises Ar. In some embodiments, the inert gas comprises He.

In some embodiments, the reactant comprises fluoride radicals generated in a remote plasma source. In some embodiments, the method comprises selectively sputtering the built-up material. In some embodiments, the selective sputtering is performed with the fluoride radicals. In some embodiments, the fluoride radicals are injected through the reactant inlet 159. In some embodiments, when in cleaning mode, the reactant inlet valve 161 is opened establishing fluid communication between the process cavity 103 and the remote plasma source. In some embodiments, when in deposition mode, the reactant inlet valve 161 is closed.

In some embodiments, at block 804, the reactant exits the process cavity 103 via top gas flow path 133 through the plenum 146. In some embodiments, the plenum 146 is operatively connected to the exhaust assembly 164 via the roughing pump 162 and/or the abatement assembly 163.

In some embodiments, the in-chamber cleaning method further comprises coating one or more of one or more of the shield 130, the bellows assembly 138, the target backing plate 105, the substrate support 110, the deposition ring 115, the sealing bracket 120, the chamber body 150, the electrostatic chuck (ESC) pad, the shaft 175, the hoop lift component 177, the turbo pump housing 180, the roughing line 147, the target 107, the target bond 106, the containment o-ring 155, the exhaust assembly 164 or the abatement assembly 163 with a coating material. In some embodiments, the coating material comprises $ZrO_2$, $AlO_x$, $Y_2O_3$ or combinations thereof. In some embodiments, the coating material comprises YF, YOF, AlOF, $ZrO_2F$, $ZrO_2$, $AlO_x$, $Y_2O_3$ or combinations thereof.

In some embodiments, the built-up material accumulated in the processing chamber 100 is removed by the in-chamber cleaning method. In some embodiments, the in-chamber cleaning method is performed every 300 kWh. In some embodiments, the in-chamber cleaning method is performed 10 times per target. In some embodiments, the in-chamber cleaning method is performed every 3-4 days.

In some embodiments, the in-chamber cleaning method reduces built-up material particle size in a range of from 20 nm to 10 μm.

In some embodiments, the in-chamber cleaning method extends the target life cycle of the process kit. in some embodiments, the in-chamber cleaning method further comprises adjusting a process parameter. In some embodiments, the process parameter comprises magnetron tuning, reactant injection, concentric gas conductance path, or combination thereof. In some embodiments, the process parameter comprises spacing between the target and the protective wafer (or substrate support), magnetron tuning, pressure inside the process cavity, ratio of Ar to $N_2$ or DC power.

In some embodiments, the in-chamber cleaning method performed with the In-situ RF $NF_3$ clean and/or the remote plasma source fluoride radical clean in PVD cleans the processing cavity 103 without opening the processing chamber 100 and maintain good particle.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A processing chamber comprising:
    a target backing plate in a top portion of the processing chamber;
    a substrate support in a bottom portion of the processing chamber, the substrate support having a support surface spaced a distance from the target backing plate to form a process cavity;
    a deposition ring positioned at an outer periphery of the substrate support, the deposition ring having an outer portion with a contoured shape; and
    a shield forming an outer bound of the process cavity, the shield having a top shield end in the top portion of the processing chamber and a bottom shield end in the bottom portion of the processing chamber, the top end positioned around a periphery of the target backing plate and the bottom end positioned around a periphery of the substrate support, the bottom end including a contoured surface having a complementary shape to the outer portion of the deposition ring;
    a sealing bracket positioned on an opposite side of the substrate support from the target backing plate so that the deposition ring is between the target backing plate and the sealing bracket; and
    a bellows assembly having a top bellows flange, a bellows and a bottom bellows flange, the top bellows flange located below and attached to the shield bottom end next to the contoured surface on an outer side of the shield bottom end,
        wherein the top portion of the processing chamber comprises a top gas flow path between a periphery of the target backing plate and the top of the shield, and
        the bottom portion of the processing chamber comprises a bottom gas flow path between the shield and the deposition ring, and
    wherein the deposition ring and sealing bracket are movable between a process position where there is a gap between the sealing bracket and the deposition ring and a gap between a bottom bellows flange of the bellows assembly and the sealing bracket, and a cleaning position where the sealing bracket contacts the bottom bellows flange of the bellows assembly.

2. The processing chamber of claim 1 further comprising a shutter disk positioned below the shield, wherein the substrate support and the shutter disk are movable between a process position where the shutter disk moves out horizontally for the substrate support to move up and form the process cavity and a cleaning position where the substrate support moves down for the shutter disk to disconnect a fluid connection between the substrate support and the process cavity.

3. The processing chamber of claim 1, further comprising a turbo pump housing in fluid communication with the process cavity through the bottom flow path when in the process position and isolated from the process cavity via the bottom flow path when in the cleaning position.

4. The processing chamber of claim 1, further comprising a roughing pump in fluid communication with the process cavity through the top flow path.

5. The processing chamber of claim 4, further comprising a roughing valve between the roughing pump and the process cavity, the roughing valve configured to allow a flow of gas from the process cavity to the roughing pump through the top flow path when the roughing valve is opened and to prevent flow to the roughing pump when the roughing valve is closed.

6. The processing chamber of claim 5, wherein the processing chamber is configured to allow a flow of gas into the process cavity through the top flow path when the roughing valve is closed.

7. The processing chamber of claim 6, wherein the roughing valve is closed when the deposition ring and sealing bracket are in the cleaning position.

8. The processing chamber of claim 4, wherein one or more of the shield, the target backing plate, the substrate support, the deposition ring, the sealing bracket, or a turbo pump housing is resistant to fluoride radical and/or fluorine sputtering.

* * * * *